(12) United States Patent
Mittelholzer (10) Patent No.: US 7,786,905 B2
(45) Date of Patent: Aug. 31, 2010

(54) MODULATION CODING AND DECODING

(75) Inventor: Thomas Mittelholzer, Zurich (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/262,345

(22) Filed: Oct. 31, 2008

(65) Prior Publication Data

US 2009/0115648 A1    May 7, 2009

(30) Foreign Application Priority Data

Nov. 7, 2007    (EP)    ................... 07120165

(51) Int. Cl.
*H03M 5/00*    (2006.01)
(52) U.S. Cl. .................... 341/58; 341/59
(58) Field of Classification Search ............. 341/58–60; 360/40; 369/59.23
See application file for complete search history.

(56) References Cited

U.S. PATENT DOCUMENTS

| | | | |
|---|---|---|---|
| 3,718,863 A * | 2/1973 | Fletcher et al. | ............... 377/67 |
| 5,760,718 A | 6/1998 | Schouhamer Immink | |
| 7,064,687 B1 * | 6/2006 | Blaum et al. | ................. 341/80 |
| 7,071,851 B1 | 7/2006 | Blaum et al. | |
| 7,126,502 B2 | 10/2006 | Blaum et al. | |

OTHER PUBLICATIONS

William H. Kautz; "Fibonacci Codes for Synchronization Control;" IEEE Transactions on Information Theory, vol. 11, Apr. 1965, pp. 284-292.
Thomas M. Cover; "Enumerative Source Encoding;" IEEE Transactions on Information Theory, vol. 17-19, No. 1, Jan. 1973, pp. 73-77.

* cited by examiner

*Primary Examiner*—Brian Young
(74) *Attorney, Agent, or Firm*—Cantor Colburn LLP (57) ABSTRACT

Methods and apparatus are provided for partitioning a stream of binary input data into two binary output streams for supply to respective modulation encoders in a modulation coding system. A 4-ary enumerative encoding algorithm is applied to each of a succession of input words in the input bit-stream to produce a succession of 4-ary output symbols from the input word. The 4-ary algorithm simultaneously encodes respective $j=\infty$ Fibonacci codes in the odd and even interleaves of the input word such that the two bit-sequences formed by respective corresponding bits of the succession of output symbols are range-limited codewords. The two binary output streams are then produced by separating the two range-limited codewords generated from each successive input word. The binary output streams can then be independently encoded by respective modulation encoders, and the encoder outputs interleaved to produce a modulation-constrained output stream. Corresponding decoding systems are also provided.

25 Claims, 7 Drawing Sheets

Input u u= 0=[0 0 0 0 0 0]
u= 1=[0 0 0 0 0 1]
u= 2=[0 0 0 0 1 0]
u= 3=[0 0 0 0 1 1]
u= 4=[0 0 0 1 0 0]
...
u=30=[1 1 1 1 1 0]
u=31=[1 1 1 1 1 1]

Encoding rule
(successive subtraction of weights from input)

For i=1 to N {
  if u ≥ $w_{N-i+1}$ then $x_i$=1
                     u=u−$w_{N-i+1}$
  else $x_i$=0
}

((31−21) − 8) − 2
((u − $w_7$) − $w_5$) − $w_2$

Output =
[$x_1, x_2, ..., x_7$]

| step i | 1 | 2 | 3 | 4 | 5 | 6 | 7 | 8 | 9 |
|---|---|---|---|---|---|---|---|---|---|
| $V^o / V^e$ | 256 | 107, 128 | 64 | 32 | 11, 16 | 8 | 3, 4 | 2 | 1 |
| $U^o / U^e$ | 363 | 107, 256 | 107, 128 | 43, 64 | 11, 32 | 11, 16 | 3, 8 | 3, 4 | 1, 2 |

| step i=1 | | |
|---|---|---|
| $N_{00}$ | $N_{01}$ | $N_{10}$ |
| 65536 | 92928 | 120320 |

| step i=2 | | | | |
|---|---|---|---|---|
| o | e | $N_{00}$ | $N_{01}$ | $N_{10}$ |
| 1 | 1 | 16384 | 32768 | 49152 |
| 1 | 0 | 13696 | 13696 | 27392 |
| 0 | 1 | 13696 | 27392 | 27392 |
| 0 | 0 | 11449 | 11449 | 11449 |

| step i=3 | | | | |
|---|---|---|---|---|
| o | e | $N_{00}$ | $N_{01}$ | $N_{10}$ |
| 1 | 1 | 4096 | 8192 | 12288 |
| 1 | 0 | 4096 | 6848 | 10944 |
| 0 | 1 | 4096 | 8192 | 10944 |
| 0 | 0 | 4096 | 6848 | 9600 |

| step i=4 | | | | |
|---|---|---|---|---|
| o | e | $N_{00}$ | $N_{01}$ | $N_{10}$ |
| 1 | 1 | 1024 | 2048 | 3072 |
| 1 | 0 | 1024 | 1376 | 2400 |
| 0 | 1 | 1024 | 2048 | 2400 |
| 0 | 0 | 1024 | 1376 | 1728 |

| step i=5 | | | | |
|---|---|---|---|---|
| o | e | $N_{00}$ | $N_{01}$ | $N_{10}$ |
| 1 | 1 | 256 | 512 | 768 |
| 1 | 0 | 176 | 176 | 352 |
| 0 | 1 | 176 | 352 | 352 |
| 0 | 0 | 121 | 121 | 121 |

| step i=6 | | | | |
|---|---|---|---|---|
| o | e | $N_{00}$ | $N_{01}$ | $N_{10}$ |
| 1 | 1 | 64 | 128 | 192 |
| 1 | 0 | 64 | 88 | 152 |
| 0 | 1 | 64 | 128 | 152 |
| 0 | 0 | 64 | 88 | 112 |

| step i=7 | | | | |
|---|---|---|---|---|
| o | e | $N_{00}$ | $N_{01}$ | $N_{10}$ |
| 1 | 1 | 16 | 32 | 48 |
| 1 | 0 | 12 | 12 | 24 |
| 0 | 1 | 12 | 24 | 24 |
| 0 | 0 | 9 | 9 | 9 |

| step i=8 | | | | |
|---|---|---|---|---|
| o | e | $N_{00}$ | $N_{01}$ | $N_{10}$ |
| 1 | 1 | 4 | 8 | 12 |
| 1 | 0 | 4 | 6 | 10 |
| 0 | 1 | 4 | 8 | 10 |
| 0 | 0 | 4 | 6 | 8 |

| step i=9 | | | | |
|---|---|---|---|---|
| o | e | $N_{00}$ | $N_{01}$ | $N_{10}$ |
| 1 | 1 | 1 | 2 | 3 |
| 1 | 0 | 1 | 1 | 2 |
| 0 | 1 | 1 | 2 | 2 |
| 0 | 0 | 1 | 1 | 1 |

| n | 100 | 99 | 98 | 97 | 96 | 95 | 94 | 93 | 92 | 91 | 90 | 89 | 88 | 87 | 86 | 85 | 84 | 83 | 82 | 81 |
|---|---|---|---|---|---|---|---|---|---|---|---|---|---|---|---|---|---|---|---|---|
| $B_n 2^9$ | 209 | 211 | 213 | 215 | 217 | 219 | 221 | 223 | 225 | 227 | 229 | 231 | 233 | 235 | 237 | 239 | 241 | 243 | 245 | 247 |
| j(n) | 2 | 5 | 5 | 5 | 5 | 5 | 5 | 5 | 5 | 5 | 5 | 5 | 5 | 5 | 5 | 5 | 5 | 5 | 5 | 5 |

| n | 80 | 79 | 78 | 77 | 76 | 75 | 74 | 73 | 72 | 71 | 70 | 69 | 68 | 67 | 66 | 65 | 64 | 63 | 62 | 61 |
|---|---|---|---|---|---|---|---|---|---|---|---|---|---|---|---|---|---|---|---|---|
| $B_n 2^9$ | 249 | 251 | 254 | 256 | 258 | 261 | 263 | 266 | 268 | 271 | 273 | 276 | 278 | 281 | 283 | 286 | 289 | 291 | 294 | 297 |
| j(n) | 5 | 5 | 5 | 5 | 5 | 5 | 5 | 5 | 5 | 5 | 5 | 5 | 5 | 5 | 5 | 5 | 5 | 5 | 5 | 5 |

| n | 60 | 59 | 58 | 57 | 56 | 55 | 54 | 53 | 52 | 51 | 50 | 49 | 48 | 47 | 46 | 45 | 44 | 43 | 42 | 41 |
|---|---|---|---|---|---|---|---|---|---|---|---|---|---|---|---|---|---|---|---|---|
| $B_n 2^9$ | 299 | 302 | 305 | 308 | 311 | 314 | 317 | 320 | 323 | 326 | 329 | 332 | 335 | 338 | 341 | 344 | 347 | 350 | 353 | 356 |
| j(n) | 5 | 5 | 5 | 5 | 5 | 5 | 5 | 5 | 5 | 5 | 5 | 5 | 5 | 5 | 5 | 5 | 5 | 5 | 5 | 5 |

| n | 40 | 39 | 38 | 37 | 36 | 35 | 34 | 33 | 32 | 31 | 30 | 29 | 28 | 27 | 26 | 25 | 24 | 23 | 22 | 21 |
|---|---|---|---|---|---|---|---|---|---|---|---|---|---|---|---|---|---|---|---|---|
| $B_n 2^9$ | 359 | 362 | 365 | 368 | 371 | 375 | 378 | 381 | 385 | 388 | 392 | 395 | 399 | 402 | 406 | 409 | 413 | 417 | 420 | 424 |
| j(n) | 5 | 5 | 5 | 5 | 5 | 5 | 5 | 5 | 5 | 5 | 5 | 5 | 5 | 5 | 5 | 5 | 5 | 5 | 5 | 5 |

| n | 20 | 19 | 18 | 17 | 16 | 15 | 14 | 13 | 12 | 11 | 10 | 9 | 8 | 7 | 6 | 5 | 4 | 3 | 2 | 1 |
|---|---|---|---|---|---|---|---|---|---|---|---|---|---|---|---|---|---|---|---|---|
| $B_n 2^9$ | 428 | 432 | 436 | 440 | 444 | 448 | 452 | 456 | 460 | 464 | 468 | 472 | 476 | 480 | 480 | 480 | 512 | 512 | 512 | 512 |
| j(n) | 5 | 5 | 5 | 5 | 5 | 5 | 5 | 5 | 5 | 5 | 5 | 5 | 5 | 5 | 5 | 4 | 3 | 3 | 2 | 1 |

Figure 8

| | | | | | | | | | | | | | | | | | | | | |
|---|---|---|---|---|---|---|---|---|---|---|---|---|---|---|---|---|---|---|---|---|
| n | 200 | 199 | 198 | 197 | 196 | 195 | 194 | 193 | 192 | 191 | 190 | 189 | 188 | 187 | 186 | 185 | 184 | 183 | 182 | 181 |
| $B_n 2^9$ | 194 | 195 | 196 | 197 | 198 | 199 | 200 | 201 | 202 | 203 | 204 | 205 | 206 | 207 | 208 | 209 | 210 | 211 | 212 | 213 |
| n | 180 | 179 | 178 | 177 | 176 | 175 | 174 | 173 | 172 | 171 | 170 | 169 | 168 | 167 | 166 | 165 | 164 | 163 | 162 | 161 |
| $B_n 2^9$ | 214 | 215 | 216 | 217 | 218 | 219 | 220 | 221 | 222 | 223 | 224 | 225 | 226 | 227 | 228 | 229 | 230 | 231 | 232 | 233 |
| n | 160 | 159 | 158 | 157 | 156 | 155 | 154 | 153 | 152 | 151 | 150 | 149 | 148 | 147 | 146 | 145 | 144 | 143 | 142 | 141 |
| $B_n 2^9$ | 234 | 235 | 236 | 237 | 238 | 239 | 240 | 241 | 242 | 243 | 244 | 245 | 246 | 247 | 248 | 249 | 250 | 252 | 253 | 254 |
| n | 140 | 139 | 138 | 137 | 136 | 135 | 134 | 133 | 132 | 131 | 130 | 129 | 128 | 127 | 126 | 125 | 124 | 123 | 122 | 121 |
| $B_n 2^9$ | 255 | 256 | 258 | 259 | 260 | 261 | 263 | 264 | 265 | 266 | 268 | 269 | 270 | 272 | 273 | 274 | 276 | 277 | 278 | 280 |
| n | 120 | 119 | 118 | 117 | 116 | 115 | 114 | 113 | 112 | 111 | 110 | 109 | 108 | 107 | 106 | 105 | 104 | 103 | 102 | 101 |
| $B_n 2^9$ | 281 | 282 | 284 | 285 | 286 | 288 | 289 | 291 | 292 | 294 | 295 | 297 | 299 | 300 | 301 | 303 | 304 | 306 | 307 | 309 |
| n | 100 | 99 | 98 | 97 | 96 | 95 | 94 | 93 | 92 | 91 | 90 | 89 | 88 | 87 | 86 | 85 | 84 | 83 | 82 | 81 |
| $B_n 2^9$ | 310 | 312 | 313 | 315 | 316 | 318 | 319 | 321 | 322 | 324 | 325 | 327 | 328 | 330 | 331 | 333 | 334 | 336 | 338 | 339 |
| n | 80 | 79 | 78 | 77 | 76 | 75 | 74 | 73 | 72 | 71 | 70 | 69 | 68 | 67 | 66 | 65 | 64 | 63 | 62 | 61 |
| $B_n 2^9$ | 341 | 343 | 344 | 346 | 348 | 349 | 351 | 353 | 354 | 356 | 358 | 360 | 361 | 363 | 365 | 367 | 368 | 370 | 372 | 374 |
| n | 60 | 59 | 58 | 57 | 56 | 55 | 54 | 53 | 52 | 51 | 50 | 49 | 48 | 47 | 46 | 45 | 44 | 43 | 42 | 41 |
| $B_n 2^9$ | 376 | 378 | 380 | 382 | 384 | 386 | 388 | 390 | 392 | 394 | 396 | 398 | 400 | 402 | 404 | 406 | 408 | 410 | 412 | 414 |
| n | 40 | 39 | 38 | 37 | 36 | 35 | 34 | 33 | 32 | 31 | 30 | 29 | 28 | 27 | 26 | 25 | 24 | 23 | 22 | 21 |
| $B_n 2^9$ | 416 | 418 | 420 | 422 | 424 | 426 | 428 | 430 | 432 | 434 | 436 | 438 | 440 | 442 | 444 | 446 | 448 | 450 | 452 | 454 |
| n | 20 | 19 | 18 | 17 | 16 | 15 | 14 | 13 | 12 | 11 | 10 | 9 | 8 | 7 | 6 | 5 | 4 | 3 | 2 | 1 |
| $B_n 2^9$ | 456 | 458 | 460 | 462 | 464 | 466 | 468 | 470 | 472 | 474 | 476 | 478 | 480 | 480 | 480 | 480 | 480 | 512 | 512 | 512 |

Figure 9

MODULATION CODING AND DECODING

This application claims priority to European Patent Application No. 07120165.1, filed 07 Nov. 2007, and all the benefits accruing therefrom under 35 U.S.C. §119, the contents of which in its entirety are herein incorporated by reference.

BACKGROUND

This invention relates generally to modulation coding of data, and more particularly to input partitioning in modulation coding systems, together with corresponding decoding systems.

Modulation codes are employed in data storage systems to eliminate undesirable bit-sequences in the recording data, for example bit sequences which give rise to errors in the reproduction process. One example of an undesirable bit-sequence is a long run of bits of the same value. Another example is a long run of bits of the same value in alternating positions in the bit stream, i.e. in either the odd (O) or even (E) interleave of a bit stream . . . EOEOEO . . . For instance, a long sequence of the form 0a0b0c0d0 . . . , where a, b, c, etc. can be either 0 or 1, would be generally undesirable. Modulation codes impose some form of constraint on the occurrence of undesirable bit-sequences in the encoded bit-stream. For example, some modulation codes impose a so-called j-constraint, whereby the maximum length of a run of consecutive 1's in the encoded bit-stream is limited to the predetermined value j. Other modulation codes impose a constraint on the maximum run-length of consecutive 0's. This is referred to as a k- or G-constraint, whereby the maximum run-length of consecutive 0's is limited to the value k or G respectively. An example of the latter code-type is provided by the PRML (G, I) codes used in PRML (partial-response maximum likelihood) based recording systems such as tape drives and optical storage systems. In addition to the "global" or G-constraint, these codes impose an "interleave" or I-constraint. This limits the maximum run-length of 0's in each of the odd and even interleaves to the value I. An I-constrained bit-stream is of course necessarily G-constrained with G=2I.

Modulation coding systems ideally employ high-rate codes and encoders which operate close to the capacity of the selected constraint. To be useful, however, these systems need to have a practical implementation based on efficient encoding and decoding algorithms.

A practical encoder for imposing a k-constraint in the encoded bit-stream is disclosed in U.S. Pat. No. 5,760,718. This implements an enumerative encoding technique based on the class of generalized Fibonacci codes. Enumerative encoding is discussed in "Enumerative Source Encoding", T. M. Cover, IEEE Trans. Inform. Theory, Vol. 19, pp. 73-77, January 1973. Fibonacci codes are discussed in "Fibonacci Codes for Synchronisation Control", W. H. Kautz, IEEE Trans. Inform. Theory, Vol. 11, pp. 284-292, April 1965. While reference is made to the foregoing papers for a detailed discussion, it is useful here to give a brief explanation of these techniques to assist understanding of the invention to be described.

In simple terms, enumerative encoding is a process of mapping input words to output codewords based on lexicographic ordering of the codewords. That is, if a set of X binary codewords are ordered according to binary value, then each codeword can be assigned a number from 1 to X according to its position in the ordered set. If each of these assigned numbers 1 to X then defines the value of a binary input word, each of the X binary input words is associated with a corresponding codeword. Enumerative encoding is the process of mapping input words to output codewords in accordance with this type of scheme. While the underlying encoding principle is simple enough, the problem in practice lies in designing an efficient encoder for generating the codewords from the binary input words. If there are $2^{100}$ codewords for example, then the need for an efficient encoder design is readily apparent.

Fibonacci codes are characterised by a set of weights, also called bases, which define the value of a binary 1 at respective positions in a binary codeword representation. That is, a 1 at a given position in a binary codeword represents the value of the Fibonacci weight for that position rather than the usual power of two. As a simple example, consider a Fibonacci code defined by a set of N=7 weights given by $\{w_n: n=1, 2, \ldots, 7\}=\{1, 2, 3, 5, 8, 13, 21\}$. It can be seen that the bases satisfy the linear recursion $$w_{n+1}=w_n+w_{n-1} \text{ for } n=2, 3, 6$$

Figure 1:
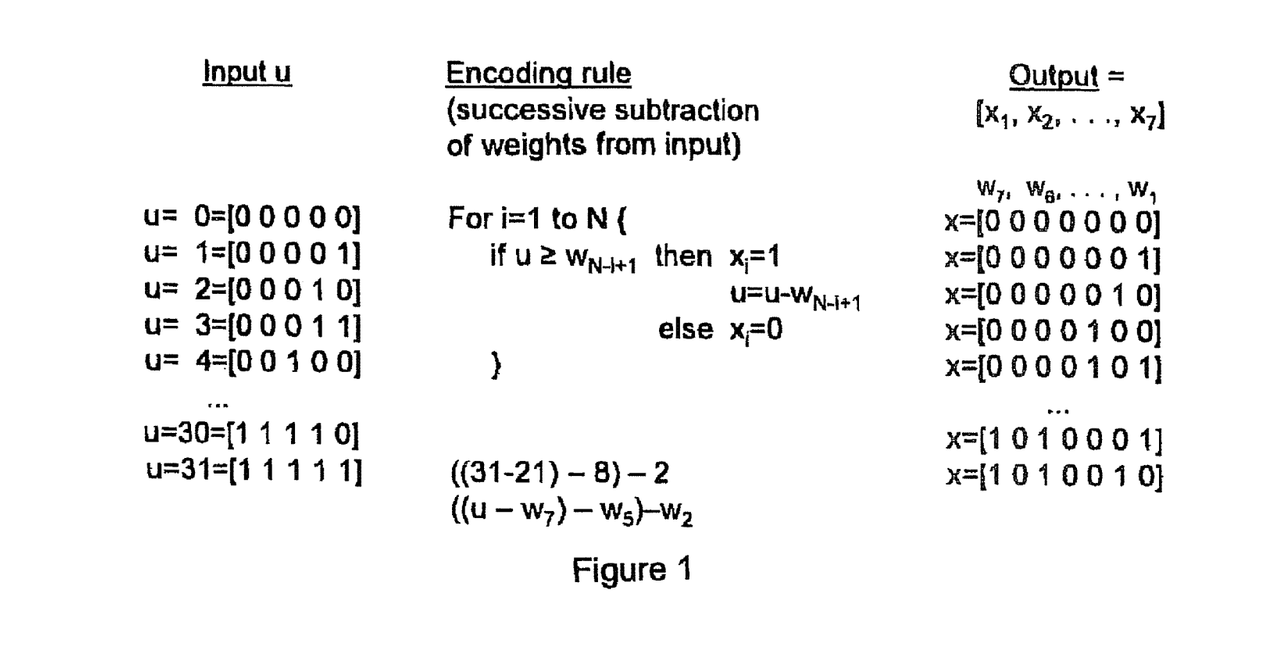
FIG. 1 illustrates an encoding process using a simple Fibonacci code.

The complete set of (N=7)-bit Fibonacci codewords can represent $w_{N+1}=13+21=34$ possible values. Since $34 \geq 2^5$, this simple Fibonacci code can encode 5-bit inputs into codewords of length N=7 by an enumerative encoding process. This encoding process is defined by $$u=\Sigma x_i w_{N-i+1} \text{ for } i=1 \text{ to } 7$$

where u is the input word value and $(x_1, x_2, \ldots x_7)$ is the output codeword. The encoding process is performed by successive subtraction of the Fibonacci weights from the input word value as illustrated in FIG. 1 of the accompanying drawings. In particular, the number u is successively reduced by whichever of the weights $w_n$, taken in decreasing value order, does not give a negative result. If a given weight $w_{N-i+1}$ is actually subtracted from the running difference, then $x_i=1$. Otherwise $x_i=0$.

Consideration of FIG. 1 demonstrates that this simple Fibonacci code imposes a j=1 constraint, i.e. no more than one consecutive 1's can occur in a codeword. Pure Fibonacci codes with a j-constraint are defined by weights $w_n$, n=1, 2, . . . , N, which satisfy the linear recursion $$w_{n+1}=w_n+w_{n-1}+\ldots+w_{n-j} \text{ for } n=j+1, j+2, \ldots, N-1 \quad (1)$$

and the j+1 initial weights are given by $$w_n=2^{n-1} \; n=1, 2, \ldots, j+1$$

where the specified positive integer j defines the j-constraint of the code. With generalized Fibonacci codes, the equality in equation (1) is replaced by an inequality:

$$w_{n+1} \leq w_n+w_{n-1}+\ldots+w_{n-j} \text{ for } n=j+1, j+2, \ldots, N-1. \quad (2)$$

The maximum number of codewords in such a generalized Fibonacci code is given by $$w_{N+1}=w_N+w_{N-1}+\ldots+w_{N-j}.$$

As with the simple code of FIG. 1, a binary codeword $(x_1, x_2, \ldots, x_N)$ in the generalized Fibonacci code is obtained by representing an input u, $0 \leq u < w_{N+1}$, by the weights $\{w_n\}$, i.e.

$$u=\Sigma x_i w_{N-i+1}.$$

For implementation purposes, as described in U.S. Pat. No. 5,760,718 referenced above, the weights are chosen to have a limited span L, i.e.

$$w_n=B_n 2^{n-1} \quad (3)$$

where $B_n$ is in the range $2^{-L} \leq B_n \leq 1$ and has an L-bit representation. With weights of span L, encoding can be performed in a sliding window fashion, using an (L+1)-bit wide window which runs from the most significant bits of $\Sigma u_k 2^k$ to the least significant bits.

U.S. Pat. No's. 7,126,502, 7,064,687 and 7,071,851 disclose encoders and decoders designed for PRML (G, I) codes which are based on similar enumerative encoding ideas to those of U.S. Pat. No. 5,760,718 referenced above. These are derived from generalized Fibonacci codes. In particular, an input bit-stream is partitioned into its odd and even interleaves, and the two interleave bit-streams are then encoded by separate Fibonacci encoders. Since Fibonacci codes impose a j-constraint on runs of 1's, bit inversion of the encoder outputs results in two encoded bit streams each with a constraint on runs of 0's. A multiplexer then interleaves the encoded bit streams to give a single, (G, I)-constrained bit-stream with G=2I, where I equals the value of j for the original Fibonacci code. In U.S. Pat. No. 7,126,502, the input partitioning stage of the overall encoder is implemented by a demultiplexer. This simply de-interleaves input data words of length 2(N−1) into odd and even interleave sequences of length N−1. In general, if the input sequence of the encoder has an even number of bits, say 2(N−Q), the input can be easily partitioned into two sequences of length N−Q each. An encoder of block length (i.e. output codeword length) 2N and rate (N−Q)/N can then be obtained. To achieve higher rates for the same block length, say a rate (2N−1)/2N for length 2N, it is desirable to partition the input bits into two bit-streams which satisfy certain constraints to be valid input sequences for the subsequent enumerative encoders. In the modulation encoder of U.S. Pat. No. 7,064,687, the input partitioning stage employs a short block encoder to impose such (non-modulation) constraints. Through operation of the short block encoder, the input partitioning stage splits the input into odd and even bit-sequences which satisfy a range constraint. That is, the range of possible values of these N-bit sequences is limited, so that not all possible N-bit sequences can occur. In this way, the possible inputs to the two Fibonacci encoders are limited, allowing N-bit to N-bit encoding in these encoders. The necessary binary constraints on the even and odd bit-sequences are specified for the case where these constraints are the same in the even and the odd interleave, and implementations of short block encoders are given with rates 3/4, 9/10 and 13/14. The construction of these short block encoders for the input partitioning stage is based on the technique of gated partitions. This technique does not provide a systematic approach to the input partitioning problem and, in particular, becomes increasingly difficult to apply for longer and higher rate short block encoders.

In view of the above, it would be desirable to provide an improved technique for the partitioning of input data in modulation coding systems.

SUMMARY

A first aspect of the present invention provides a method for partitioning a stream of binary input data into two binary output streams for supply to respective modulation encoders. The method comprises:

for each of a succession of input words in the input bit-stream, applying a 4-ary enumerative encoding algorithm to the input word to produce a succession of 4-ary output symbols, the 4-ary algorithm being operative to simultaneously encode respective j=∞ Fibonacci codes in the odd and even interleaves of the input word such that the two bit-sequences formed by respective corresponding bits of the succession of output symbols are range-limited codewords; and producing the two binary output streams by separating the two range-limited codewords produced from each successive input word.

A second aspect of the invention provides a method for modulation coding a stream of binary input data. The method comprises:

partitioning the input bit-stream into two binary output streams by a partitioning method according to the first aspect of the invention;

modulation encoding the two binary output streams in respective modulation encoders to produce two encoded output streams; and interleaving the encoded output streams to produce a modulation-constrained output.

Each modulation encoder preferably applies an enumerative encoding algorithm to the respective binary output stream, most preferably a generalized Fibonacci code. The encoded output streams are then interleaved to produce an output with Fibonacci-encoded odd and even interleaves. The inherent properties of Fibonacci codes explained earlier thus provide an output bit-stream with global and interleaved run-length constraints. While applications might be envisaged where the constraint is required on the maximum run-length of 1's, bit-inversion results in a (G, I)-constrained output suitable for the PRML codes discussed above.

A third aspect of the invention provides a method for modulation decoding a modulation-constrained bit stream produced by a method according to the second aspect of the invention. The method comprises:

de-interleaving bits of the modulation-constrained bit-stream to produce two encoded output streams;

modulation decoding the two encoded output streams in respective modulation decoders to recover said two binary output streams;

producing a succession of 4-ary output symbols from the range-limited codewords in respective binary output streams corresponding to each said input word; and applying a 4-ary enumerative decoding algorithm to the 4-ary symbols to simultaneously decode said j=∞ Fibonacci codes applied to said odd and even interleaves by said 4-ary encoding algorithm, thereby to recover said succession of input words.

A fourth aspect of the invention provides apparatus for partitioning a stream of binary input data into two binary output streams for supply to respective modulation encoders. The apparatus comprises:

a 4-ary encoder for applying a 4-ary enumerative encoding algorithm to each of a succession of input words in the input bit-stream to produce a succession of 4-ary output symbols from each input word, the 4-ary algorithm being operative to simultaneously encode respective j =∞ Fibonacci codes in the odd and even interleaves of the input word such that the two bit-sequences formed by respective corresponding bits of the succession of output symbols are range-limited codewords; and a binary output generator for producing the two binary output streams by separating the two range-limited codewords produced from each successive input word.

A fifth aspect of the invention provides apparatus for modulation coding a stream of binary input data. The apparatus comprises:

partitioning apparatus according to the fourth aspect of the invention for partitioning the input bit-stream into two binary output streams; respective modulation encoders for modulation encoding the two binary output streams to produce two encoded output streams; and a multiplexer for interleaving the encoded output streams to produce a modulation-constrained output.

A sixth aspect of the invention provides apparatus for modulation decoding a modulation-constrained bit stream produced by modulation coding apparatus according to the fifth aspect of the invention. The modulation decoding apparatus comprises:

a demultiplexer for de-interleaving bits of the modulation-constrained bit-stream to produce two encoded output streams;

respective modulation decoders for modulation decoding the two encoded output streams to recover said two binary output streams;

a 4-ary symbol generator for producing a succession of 4-ary output symbols from the range-limited codewords in respective binary output streams corresponding to each said input word; and a 4-ary decoder for applying a 4-ary enumerative decoding algorithm to the 4-ary symbols to simultaneously decode said $j=\infty$ Fibonacci codes applied to said odd and even interleaves by said 4-ary encoding algorithm, thereby to recover said succession of input words in the binary input data.

A seventh aspect of the invention provides a data storage system comprising:

modulation coding apparatus according to the fifth aspect of the invention for producing a modulation-constrained output from a stream of binary input data;

a recording channel comprising a recording/reproduction mechanism for recording and reproducing the modulation-constrained output on a storage medium; and modulation decoding apparatus according to the sixth aspect of the invention for modulation decoding the modulation-constrained output reproduced from the storage medium, thereby to recover said succession of input words in the binary input data.

In general, where features are described herein with reference to an embodiment of one aspect of the invention, corresponding features may be provided in embodiments of another aspect of the invention.

BRIEF DESCRIPTION OF DRAWINGS

Preferred embodiments of the invention will now be described, by way of example, with reference to the accompanying drawings in which.

DETAILED DESCRIPTION

The input partitioning technique of this invention thus involves application of a 4-ary enumerative encoding algorithm to a succession of words in the input bit-stream. The 4-ary algorithm operates on each binary input word to Fibonacci encode the odd and even interleaves simultaneously as a single enumerative code with 4-ary output symbols. This single code will be referred to herein as an "interleaved Fibonacci code". Interleaved Fibonacci codes employing 4-ary enumerative encoding algorithms to apply modulation constraints to input data are disclosed in our copending European Patent Application filed concurrently herewith under applicant's reference CH9-2007-0022. In contrast to that system, the 4-ary algorithm of the present input partitioning system encodes Fibonacci codes with $j=\infty$ in the odd and even interleaves. Since $j=\infty$, no modulation constraints are imposed by the underlying Fibonacci codes here. However, the interleaved $j=\infty$ Fibonacci code serves to impose range constraints on the odd and even interleaves. In accordance with the principle of enumerative encoding discussed above, the 4-ary algorithm of the interleaved $j=\infty$ Fibonacci code maps the words in the input bit-stream, according to value, to an ordered set of output codewords with 4-ary symbols. The 4-ary symbols are each represented by two parallel bits, and, for each input word, the two bit-sequences formed by respective corresponding bits of the resulting succession of output symbols are range-limited codewords. Thus, if a succession of N' output symbols are produced from each input word, and each 4-ary symbol is considered to comprise an odd bit and an even bit, then the sequence of N' odd bits and the sequence of N' even bits are both range-limited codewords. That is, the range of allowed N'-bit values is limited for each codeword, so that not all possible N'-bit values can occur in each case. The two binary output streams are then produced by separating the two range-limited codewords resulting from each successive input word.

The foregoing technique offers a systematic input partitioning system whereby range-limitations can be imposed in the partitioned bit-streams for supply to subsequent modulation encoders. The input partitioning technique is extremely flexible in that the range constraints imposed in the partitioned bit-streams can be easily adapted to the particular requirements for input sequences to the subsequent modulation encoders. The range constraints can even be different in the two partitioned bit-streams if desired. This flexibility allows optimal exploitation of the subsequent modulation encoders, enabling the highest rates to be achieved for a given pair of modulation encoders. Overall, embodiments of the invention provide highly efficient input partitioning systems for modulation encoders, allowing complexity-efficient modulation coding systems to be designed as well as more efficient PRML (G,I) codes than are available with prior systems discussed above.

The range of allowed codeword values in each output stream is typically (though not necessarily) a range of consecutive values, and can be different for each output stream as noted above. Hence, different $j=\infty$ Fibonacci codes with different limitations on the range of the output stream can be applied in the odd and even interleaves of the input words if desired. In simple embodiments, however, the 4-ary encoding algorithm is operative to encode the same j=∞ Fibonacci code in the odd and even interleaves. The operation of the 4-ary encoding algorithm to apply the two j=∞ codes imposing range limitations will be explained below. Briefly, however, if the 4-ary encoding algorithm produces a succession of N' 4-ary output symbols from each input word, then the desired range limitations determine the upper bounds on the (N'+1)th weights of the two j=∞ Fibonacci codes. If the (N'+1)th weights have a maximum span of L', the 4-ary encoding algorithm can be implemented as a sliding window algorithm with a window width of 2L'+2.

In general, the input words to which the 4-ary algorithm is applied may comprise all or only part of the user data words in the binary input stream to be partitioned. If the binary input stream comprises a succession of contiguous M-bit user data words, and each of the input words to the 4-ary encoding algorithm is an M-bit data word, then each binary output stream can be produced as a succession of contiguous range-limited codewords produced from respective M-bit data words. Alternatively, each input word to the 4-ary algorithm may comprise a Q-bit portion of a respective M-bit data word, where Q<M. In this case, if the 4-ary algorithm produces a succession of L' 4-ary output symbols from each Q-bit input word, the two binary output streams can be produced by dividing the unencoded M−Q bits of each M-bit data word into two sets of (M−Q)/2 bits, and appending each set to a respective L'-bit range-limited codeword for each successive M-bit data word. Each output stream then effectively comprises a succession of contiguous (L'+(M−Q)/2)-bit codewords which are range limited by virtue of the range limitation applied by the 4-ary algorithm. This is equivalent to applying the 4-ary algorithm of the present input partitioning technique to the entire M-bit input words to produce two range-limited codewords of length N'=(L'+(M−Q)/2) bits, where the (N'+1)th weights of the underlying j=∞ Fibonacci codes have a maximum span of L'. In other words, such a rate M/2N' 4-ary encoding algorithm can be simplified to an algorithm which applies Fibonacci codes with only L' weights and operates on only a Q-bit portion of the input M-bit words. This will be explained further below.

Figure 2:
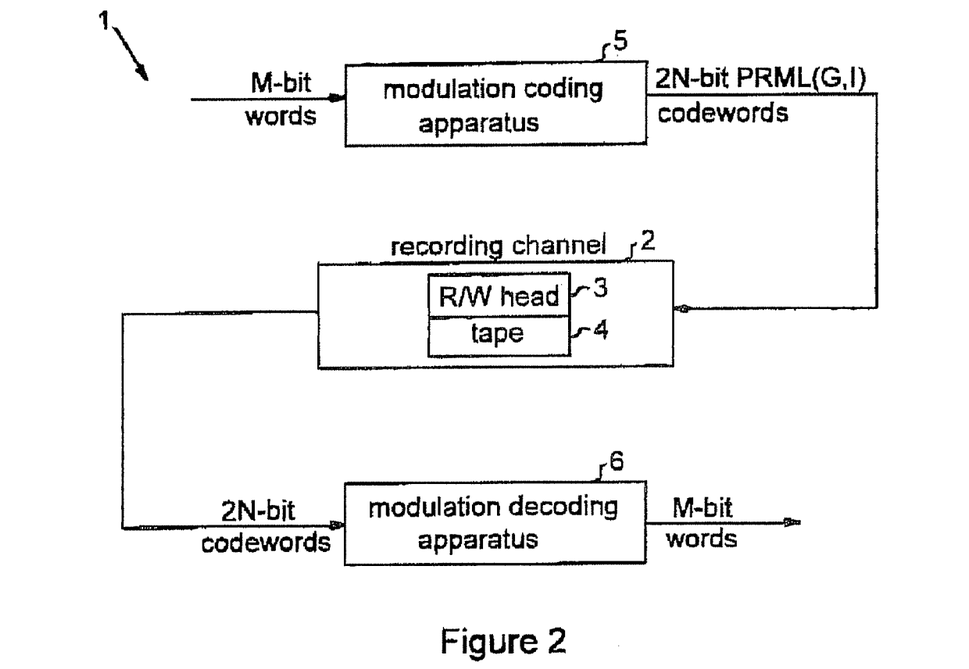
FIG. 2 is a schematic block diagram of a data storage system embodying the invention.

FIG. 2 is a simplified schematic of a data storage system showing the main components involved in operation of embodiments of the invention. In this example, the data storage system is a tape drive, indicated generally at 1, and thus has a recording channel 2 having a read/write head 3 for reading and writing to magnetic tape 4. On the recording side, modulation coding apparatus 5 receives an input bit-stream comprising a succession of M-bit data words. Apparatus 5 of this embodiment implements a modulation coding process detailed below to produce a modulation-constrained output comprising a succession of 2N-bit PRML (G, I) codewords. The modulation-constrained bit-stream is then supplied to recording channel 2, typically after preceding and error-correction coding stages (not shown), where the bit-stream is recorded on tape 4 after the usual channel signal processing. On reproduction, after the usual reproduction signal processing including detection and error correction decoding, the resulting bit-stream is supplied to modulation decoding apparatus 6. Apparatus 6 performs modulation decoding of the 2N-bit codewords in the reproduced signal as described in detail below, thereby to recover a succession of M-bit words corresponding to the original input data.

Modulation coding apparatus 5 performs a two-stage encoding process. In the first stage, the input bit-stream is partitioned into two binary output streams via a 4-ary enumerative encoding process. In the second stage, the two binary output streams are independently encoded in respective modulation encoders, and the resulting encoded output streams are combined to produce the final modulation-constrained output. Modulation decoding apparatus 6 similarly performs a two-stage decoding process. In the first stage, the separated encoded output streams are decoded by respective modulation decoders. In the second stage, the resulting decoded bit-streams are combined via a 4-ary enumerative decoding process to recover the original input data stream. The various stages of the modulation coding and decoding apparatus are described below with reference to FIGS. 3 to 10. While in principle these components could be implemented in software or a combination of hardware and software, in practice implementation in hardwired logic is preferred for simplicity and speed of operation. Suitable implementations will be apparent to those skilled in the art from the description herein.

Figure 3:
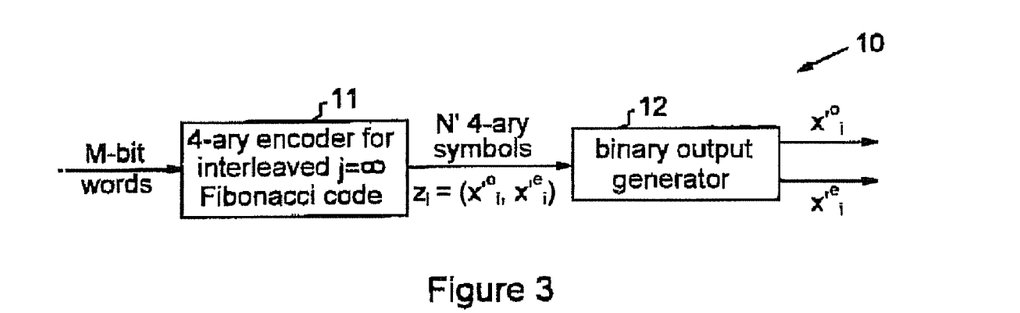
FIG. 3 illustrates a first embodiment of input partitioning apparatus for use in the system of FIG. 2.

FIG. 3 is a block diagram of input partitioning apparatus for use in the first stage of modulation coding apparatus 5. In this embodiment, the input partitioning apparatus 10 comprises a 4-ary enumerative encoder 11 and a binary output generator 12. 4-ary encoder 11 applies a 4-ary enumerative encoding algorithm to implement an interleaved j=∞ Fibonacci code. Before describing the 4-ary encoding algorithm, the concept of a j=∞ Fibonacci code will be briefly explained.

As specified in equation (1) above, pure Fibonacci codes with a j-constraint are defined by a set of weights $w_n$, n=1, 2, ..., N, satisfying the relation $$w_{n+1} = w_n + w_{n-1} + \ldots + w_{n-j} \quad n = j+1, j+2, \ldots, N-1$$

with the initial j+1 weights being given by $w_n = 2^{n-1}$, n=1, 2, ..., j+1. However, for the limiting case of j=∞, one has $$w'_n = 2^{n-1} \quad n = 1, 2, \ldots, N'$$

and the resulting code satisfies no constraints. (The apostrophes are used here and below simply to distinguish j=∞ codes from the Fibonacci codes with a j-constraint which are used elsewhere in the system). The maximum number of codewords for this j=∞ code is $w'_{N'+1} = 2^{N'}$. However, one can choose to consider a smaller number of codewords, say $w'_{N'+1}$, where $2^{N'-1} < w'N'_{N'+1} \leq 2^{N'}$.

A binary codeword $[x'_1, x'_2, \ldots, x'_{N'}]$ in the j=∞ Fibonacci code is obtained by representing an input u, $0 \leq u < w'_{N'+1}$ by the weights $\{w'_n\}$, i.e.

$$u = \Sigma x'_i w'_{N'-i+1} = \Sigma x'_i 2^{N'-i}$$

which is the binary representation of u. Thus, this j=∞ Fibonacci code of length N' consists of all binary sequences of length N', which represent a number u in the range $0 \leq u < w'_{N'+1}$.

The 4-ary encoder 11 of FIG. 3 applies a 4-ary enumerative encoding algorithm to each M-bit input word to implement an interleaved j=∞ Fibonacci code as defined earlier. That is, the encoder 11 operates to simultaneously encode respective j=∞ Fibonacci codes in the odd and even interleaves of each input word as a single enumerative code with 4-ary output symbols. The two underlying Fibonacci codes may be the same or different, though in simple embodiments these two codes are the same. Either way, for each M-bit word $(u_{M-1}, u_{M-2} \ldots, u_0)$ of value $u_{IF} = \Sigma u_k 2^k$, k=0 to M−1, in the input bit-stream, encoder 11 generates a succession of N' 4-ary output symbols. Thus, the encoder 11 implements an interleaved j=∞ Fibonacci code of length N'. The N' 4-ary symbols $z_i$, i=1 to N', are each represented by two bits, an odd bit $x'^o{}_i$ and an even bit $x'^e{}_i$. The odd and even bit sequences $[x'^o{}_1, x'^o{}_2, \ldots, x'^o{}_{N'}]$ and $[x'^e{}_1, x'^e{}_2, \ldots, x'^e{}_{N'}]$ formed by respective corresponding bits of the N' output symbols are lexicographically smaller than (the binary representation of) $w'^o_{N'+1}$ and $w'^e_{N'+1}$ respectively, where $w'^o_{N'+1}$ and $w'^e_{N'N-1}$ are the number of codewords in the underlying j=∞ Fibonacci codes for the odd and even interleaves. Thus, encoder 11 maps the 1-dimensional input word value $u_{IF}$ in the range $0 \leq u_{IF} < w'^o_{N'+1} w'^e_{N'+1}$ into the 4-ary output sequence $[z_1, z_2, \ldots, z_{N'}]$ with $z_i = (x'^o_i, x'^e_i)$ for output $z_i$, i=1 to N'. This comprises odd and even N'-bit binary sequences which are smaller than $w'^o_{N'+1}$ and $w'^e_{N'+1}$ respectively and which are without modulation constraints. (Since j=∞, the interleaved Fibonacci code imposes no limit on run-lengths of 1's, and hence does not impose modulation constraints on the output codewords). Each of the odd and even N'-bit binary sequences is a range-limited codeword as described above. The range limitations in the even and odd interleave are chosen in dependence on the subsequent enumerative modulation codes employed in the second stage of the overall modulation coding process. In particular, the following requirement is satisfied: in each interleave, the range of the allowed codeword values is contained in the input range of the subsequent enumerative modulation encoder for that interleave. This requirement specifies upper bounds on the (N'+1)th weights $w'^e_{N'+1}$ and $w'^o_{N'+1}$ of the two j=∞ Fibonacci codes. All weights $w'_n = 2^{n-1}$ of these two codes have a span of 1 (see equation (3) above) except the (N'+1)th weights which have some maximum limited span L'. (The span of $w'^e_{N'+1}$ and $w'^o_{N'+1}$ can be different but the largest of the two spans is L', where L'<N'). The value of L' is typically chosen to be small, e.g. about 10. In particular, as there is some freedom in the choice of the (N'+1)th weights, one may make a trade-off between complexity and maximum range by selecting the (N'+1)th weights to have smaller span at the expense of slightly reducing the maximum possible range. The 4-ary encoding algorithm based on (N'+1)th weights with a span of at most L' can then be implemented as a sliding window algorithm with a window width of 2L'+2.

As mentioned above, any desired range limitation can be imposed by suitably selecting the (N'+1)th weights $w'^o_{N'+1}$ and $w'^e_{N'+1}$, the key point being that the range limitation allows the outputs to be restricted to valid inputs for the subsequent modulation encoding process described below. Typically, M=2N'-1 and the product $w'^o_{N'+1} w'^e_{N'+1}$ exceeds $2^{2N'-1}$, i.e., $c \triangleq w'^o_{N'+1} w'^e_{N'+1} - 2^{2N'-1} > 0$. In this case, one can eliminate a few undesirable codewords and impose an additional weak modulation constraint on the overall PRML(G,I) modulation code if desired. As a simple example, to every (2N'-1)-bit input vector representing an integer u, one can add the offset $c = w'^o_{N'+1} w'^e_{N'+1} - 2^{2N'-1}$. Then, $u_{IF} = u + c$ is in the range $c \leq u_{IF} < w'^o_{N'+1} w'^e_{N'+1}$ and, thereby, the all-zero output is eliminated. As the subsequent modulation encoder typically maps the all-zero input to the all-zero sequence, the resulting PRML(G,I) modulation code will not contain the all-one sequence (after bit inversion), and hence will have a finite j-constraint.

Returning to FIG. 3, for each M-bit input word, encoder 11 supplies the resulting succession of N' 4-ary output symbols $z_i = (x'^o_i, x'^e_i)$ to binary output generator 12. This simply separates the two range limited codewords $[x'^o_1, x'^o_2, \ldots, x'^o_{N'}]$ and $[x'^e_1, x'^e_2, \ldots, x'^e_{N'}]$ in the N' output symbols into two binary output streams, consisting of odd bits $x'^o_i$ and even bits $x'^e_i$. Thus, apparatus 10 serves to partition the input data stream formed by successive M-bit data words into odd and even binary output streams, where each output stream consists of a succession of contiguous range-limited codewords $[x'^o_1, x'^o_2, \ldots, x'^o_{N'}]$ or $[x'^e_1, x'^e_2, \ldots, x'^e_{N'}]$ as appropriate.

As noted above, the 4-ary algorithm can be implemented in encoder 11 as a sliding window algorithm with a window width of 2L'+2. The 4-ary algorithm of this embodiment is applied in encoder 11 as an iterative process which produces one 4-ary symbol $z_i$ for each iteration step i. In more detail, for an interleaved j=∞ Fibonacci code IF to simultaneously encode two underlying j=∞ Fibonacci codes, each with N' bases $\{w'_n\}$ as defined above, the algorithm maps an input word $(u_{M-1}, u_{M-2}, \ldots, u_0)$ of value $u_{IF} = \Sigma u_k 2^k$, k=0 to M-1, to a 4-ary codeword $((x'^o_1, x'^e_1), (x'^o_2, x'^e_2), \ldots, (x'^o_{N'}, x'^e_{N'}))$ in dependence on $u_{IF}$. In particular, given an input $u_{IF}$ in the range $$0 < u_{IF} < w'^o_{N'+1} w'^e_{N'+1}$$

the algorithm is as follows.

---

Initialization: $U^o = w'^o_{N'+1}$, $U^e = w'^e_{N'+1}$, $u = u_{IF}$.
    For i=1 to N' do {
        Compute partial lexicographic indices $v^o$, $v^e$ and partitioning indices $N^{00}$, $N^{01}$, $N^{10}$:
            $v^o = \min\{2^{N'-i}, U^o\}$, $v^e = \min\{2^{N'-i}, U^e\}$
            $N^{00} = v^o v^e$, $N^{01} = v^o U^e$, $N^{10} = N^{01} + (U^o - v^o) v^e$
        Compute time-i output $(x'^o_i, x'^e_i)$ and update input u:
            if $u < N^{00}$,        then $x'^o_i = 0$, $x'^e_i = 0$
            else if $N^{00} \leq u < N^{01}$  then $x'^o_i = 0$, $x'^e_i = 1$, $u = u - N^{00}$
            else if $N^{01} \leq u < N^{10}$,  then $x'^o_i = 1$, $x'^e_i = 0$, $u = u - N^{01}$
            else                      $x'^o_i = 1$, $x'^e_i = 1$, $u = u - N^{10}$
        Update upper bounds:
            $U^o = \min\{2^{N'-i}, U^o - x'^o_i 2^{N'-i}\}$, $U^e = \min\{2^{N'-i}, U^e - x'^e_i 2^{N'-i}\}$
}

---

Consideration of the above shows that the algorithm essentially involves initialising an input value u to the input word value $u_{IF}$ and then, for each iteration i of i=1 to N', calculating values for the variables $N^{00}$, $N^{01}$, $N^{10}$ and generating an output symbol $(x'^o_i, x'^e_i)$ by comparing the input value u with $N^{00}$, $N^{01}$, $N^{10}$. The variables $N^{00}$, $N^{01}$, $N^{10}$ are referred to herein as "partitioning indices" since they serve to partition the range of possible input values u for each iteration into four sub-ranges:

$u < N^{00}$;

$N^{00} \leq u < N^{01}$;

$N^{01} \leq u < N^{10}$; and $u \geq N^{10}$.

For each iteration, the range of possible input values u is $0 \leq u < U^o U^e$ where $U^o$ and $U^e$ are the odd and even upper bounds at iteration i prior to the updating. Since the initial input value $u_{IF}$ is an M-bit word value here, the partitioning indices for the first iteration i=1 partition the range of possible M-bit values into four. In more detail, the generation of an output symbol $(x'^o_i, x'^e_i)$ involves:

calculating the partitioning indices $N^{00}$, $N^{01}$, $N^{10}$;

comparing the current input value u to the partitioning indices to determine which of the four sub-ranges defined above contains that input value;

setting the two bits of $(x'^o_i, x'^e_i)$ according to which particular sub-range contains the input value; and updating the input value by subtracting from the current value of u the lower boundary value of the sub-range containing that value of u. (Here, the updated input value will be unchanged if u lies in the lowest sub-range since the lower boundary value is then zero).

The partitioning indices $N^{00}$, $N^{01}$, $N^{10}$ are calculated from first and second pairs of "partial lexicographic indices" $v^o$, $v^e$ and $U^o$, $U^e$. The indices $v^o$, $v^e$ are referred to hereinafter as lower partial lexicographic indices, and the upper bounds $U^o$, $U^e$ are referred to hereinafter as upper partial lexicographic indices. These value pairs are referred to as partial indices in that each value of the pair is associated with a respective one of the odd and even interleaves of the input words, and hence, in effect, with one or other of the underlying $j=\infty$ Fibonacci codes in the interleaved $j=\infty$ Fibonacci code. As indicated in the above algorithm, the partial lexicographic indices of each pair $v^o$, $v^e$ and $U^o$, $U^e$ are dependent on respective Fibonacci weights selected in dependence on the iteration number i (that is, $w^{'o}_{N'-i+1}$ and $w^{'e}_{N'-i+1}$ which are both equal to $2^{N'-i}$ here).

In the encoder 11, the most complex part of the encoding algorithm consists of the multiplications to compute the partitioning indices $N_{00}$, $N_{01}$, $N_{10}$. However, most of the lower partial lexicographic indices $v^o$, $v^e$ are powers of 2, in which case one can implement the multiplications by shift operations and substantially reduce complexity.

Figure 4:
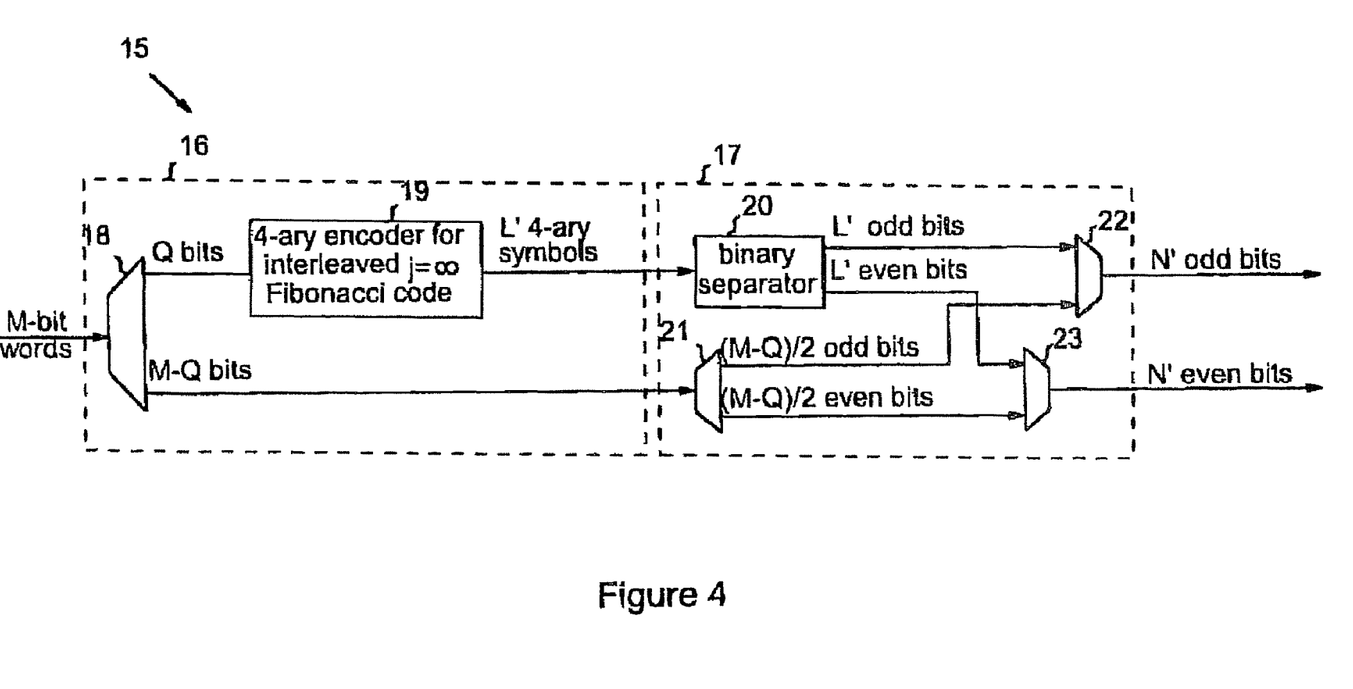
FIG. 4 illustrates a second embodiment of input partitioning apparatus for use in the system of FIG. 2.
Figure 5:
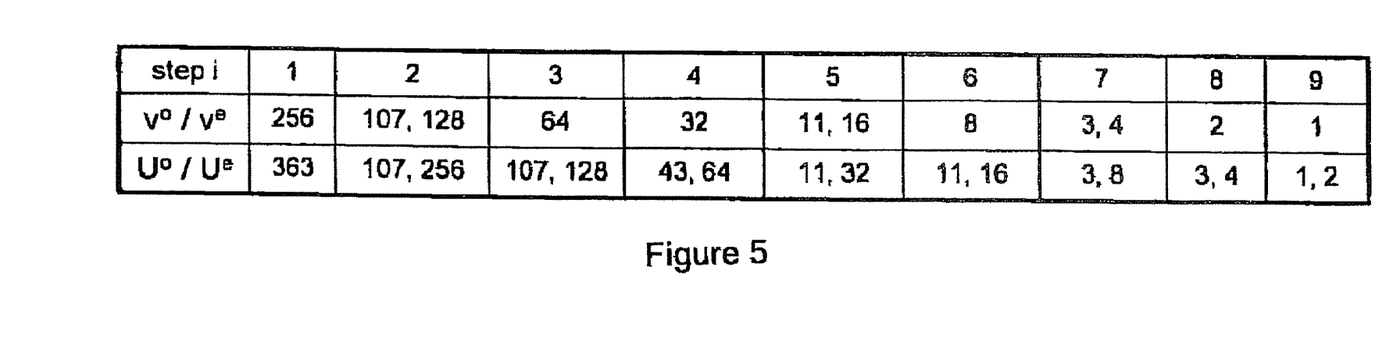
FIG. 5 tabulates partial lexicographic indices used by a 4-ary encoder with span L'=9 in the FIG. 4 apparatus.
Figure 6:
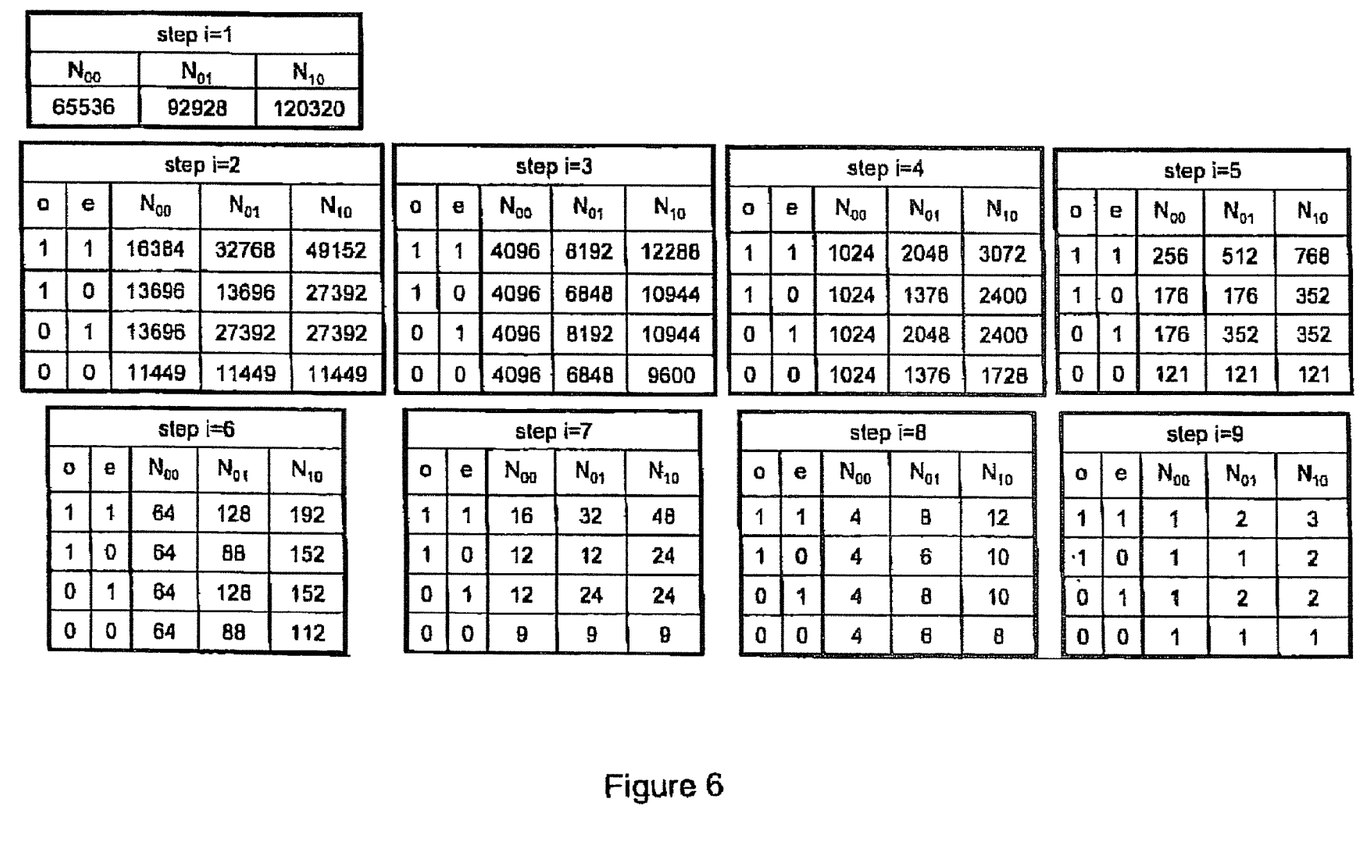
FIG. 6 tabulates partitioning indices used by the 4-ary encoder with span L'=9.

An alternative and preferred embodiment of input partitioning apparatus is illustrated in FIG. 4. The input partitioning apparatus 15 of this embodiment comprises 4-ary encoding apparatus, indicated generally at 16, and a binary output generator which is indicated generally at 17. The 4-ary encoding apparatus 16 comprises a demultiplexer 18 and a 4-ary enumerative encoder 19. Binary output generator 17 comprises a binary separator 20, a demultiplexer 21, and two multiplexers 22, 23 connected as shown in the figure. The input partitioning apparatus 15 simplifies implementation of the apparatus 10 of FIG. 3. In particular, given that the (N'+1)th Fibonacci weights $w^{'e}_{N'+1}$ and $w^{'o}_{N'+1}$ have a span no larger than L', the mapping of input bits from the input $u_{IF}$ into the odd and even output bit streams is simplified in that:

(i) the highest Q bits of the input M-bit word are passed through 4-ary encoder 19 in L' encoding steps, generating two range limited codewords $[x^{'e}_1, x^{'e}_2, \ldots, x^{'e}_{L'}]$ and $[x^{'o}_1, x^{'o}_2, \ldots, x^{'o}_{L'}]$ which are separated into the odd and even output bit streams; and (ii) the lowest (M−Q) input bits are directly de-multiplexed into the odd and even output bit streams.

In this embodiment, therefore, demultiplexer 18 supplies only a Q-bit portion of the M-bit data word to 4-ary encoder 19, so that each input word to the 4-ary algorithm comprises only Q-bits. Encoder 19 produces a succession of L' 4-ary output symbols from each Q-bit input word. Binary separator 20 then separates the odd and even range-limited codewords from the L' 4-ary symbols. The L' odd bits $x^{'o}_i$ are output to multiplexer 22 and the L' even bits $x^{'e}_i$ are output to multiplexer 23. Demultiplexer 18 supplies the unencoded M−Q bits of each M-bit data word to multiplexer 21 which de-interleaves the odd and even bits. The (M−Q)/2 odd bits are output to multiplexer 22 and appended to the odd L'-bit codeword to produce an N'-bit codeword. Similarly, the (M−Q)/2 even bits are output to multiplexer 23 and appended to the even L'-bit codeword to produce another N'-bit codeword. Each output stream then effectively comprises a succession of contiguous (L'+(M−Q)/2)-bit codewords which are range limited by virtue of the range limitation imposed by the 4-ary encoder 19. In this preferred embodiment, Q=2L'−1 so that the highest 2L'−1 bits of the input are passed through encoder 19, and the lowest 2(N'−L') input bits are directly de-multiplexed into the even and odd bit streams.

It will be seen that, in partitioning apparatus 15, the complexity-intensive part of the overall encoder is limited to the first L' steps, i.e., it can be reduced to an enumerative encoding algorithm for the interleaved $j=\infty$ Fibonacci code with only L' weights $w''_n = 2^{n-1}$, $n=1,2,\ldots,L'$, and upper bounds
$w''^e_{L'+1} = w''^e_{N'+1}/2(N'-L')$ and $w''^o_{L'+1} = w''^o_{N'+1}/2(N'-L')$.

The encoding algorithm thus reduces to the following.

```
Given:       input u_IF in the range 0 ≤ u_IF < w''^e_{L'+1} w''^o_{L'+1}
Initialization: U^o = w''^o_{L'+1}, U^e = w''^e_{L'+1}, u = u_IF.
For i=1 to L' do {
    Compute partial lexicographic indices v^o, v^e and partitioning
indices N_00, N_01, N_10:
        v^o = min{2^{L'-i}, U^o}, v^e = min{2^{L'-i}, U^e}
        N_00 = v^o v^e, N_01 = v^o U^e, N_10 = N_01 + (U^o - v^o) v^e
    Compute time-i output (x'^o_i, x'^e_i) and update input u:
        if u < N_00,           then x'^o_i = 0, x'^e_i = 0
        else if N_00 ≤ u < N_01 then x'^o_i = 0, x'^e_i = 1, u = u - N_00
        else if N_01 ≤ u < N_10, then x'^o_i = 1, x'^e_i = 0, u = u - N_01
        else                   x'^o_i = 1, x'^e_i = 1, u = u - N_10
Update upper bounds:
    U^o = min{2^{L'-i}, U^o - x'^o_i 2^{L'-i}}, U^e = min{2^{L'-i},
        U^e - x'^e_i 2^{L'-i}}
}
```

The above algorithm can be further simplified by pre-computing the partitioning indices $N_{00}$, $N_{01}$, $N_{10}$ as demonstrated by the following example. Consider the case where L'=9 and $w''^o_{L'+1} = 363 = w''^e_{L'+1}$. Here, one obtains a rate-17/18 encoder because $2\log_2(363) > 17$. The lower and upper partial lexicographic indices $v^o$, $v^e$ and $U^o$, $U^e$ can take on at most two different values at each step i as set out in the table of FIG. 5. Moreover, most values are powers of 2. From this table, it is clear that the partitioning indices $N_{00}$, $N_{01}$, $N_{10}$ can take on at most four values at each iteration step i. All these values can be pre-computed in the 4-ary encoder, thus avoiding the need to implement complex multiplication operations. At each step i, the pre-computed values $N_{00}$, $N_{01}$, $N_{10}$ can be addressed as a function of the actual values of the upper partial lexicographic indices $U^o$ and $U^e$. For this purpose, we introduce the two binary indicator functions $o = I\{U^o = 2^{10-i}\}$ and $e = I\{U^e = 2^{10-i}\}$ which take on the value 1 if the equation in the curly brackets holds and otherwise take on the value 0. The tables of FIG. 6 set out the possible values of the partitioning indices for all values of i. At each step i, i≠1, the pre-computed partitioning indices $N_{00}$, $N_{01}$, $N_{10}$ are determined as a function of the upper partial lexicographic indices $U^o$ and $U^e$ as specified in the tables. Note that the binary values $o = I\{U^o = 2^{10-i}\}$ and $e = I\{U^e = 2^{10-i}\}$ depend on the actual values of $U^o$ and $U^e$ respectively at step i.

Figure 7:
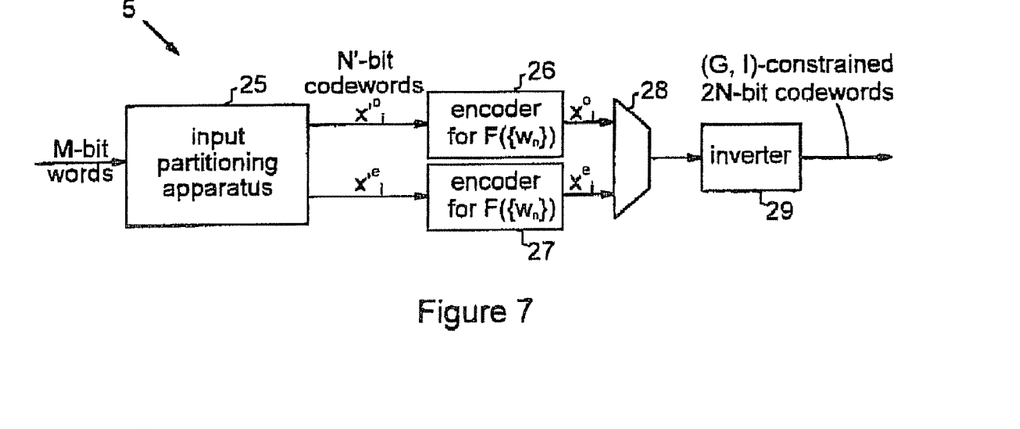
FIG. 7 is a block diagram of modulation coding apparatus in the FIG. 2 system.

FIG. 7 illustrates the modulation coding apparatus 5 of FIG. 2 in more detail. The modulation coding apparatus comprises input partitioning apparatus 25, two modulation encoders 26, 27, a multiplexer 28 and an inverter 29 connected as shown in the figure. The input partitioning apparatus 25 may be implemented by the partitioning apparatus 10 or 15 of FIGS. 3 and 4 described above. The partitioning apparatus 25 thus partitions the succession of M-bit words in the input bit stream into odd an even output bit streams. Each of these consists of a succession of N'-bit range-limited codewords as described above. The two output bit-streams are then separately modulation-encoded in respective modulation encoders 26, 27. In this embodiment, each modulation encoder is a binary enumerative encoder for applying a generalized Fibonacci code to the input N'-bit words. For simplicity, the same generalized Fibonacci code $F(\{w_n\})$ is applied in encoders 26, 27 in this example. Each Fibonacci encoder 26, 27 produces a modulation-encoded output bit stream $x^o_i$, $x^e_i$ comprising a succession of N-bit words satisfying a j-constraint. The odd and even modulation-encoded bit-streams are then interleaved by multiplexer 28, and the bit-values are inverted in inverter 29. The resulting modulation-constrained output of encoder 5 is thus a (G, I)-constrained bit-stream comprising a succession of 2N-bit words, where G=2I and I=j for the generalized Fibonacci code $F(\{w_n\})$.

For the generalized Fibonacci code $F(\{w_n\})$ with weights $w_n$, $n=1, \ldots, N$, the encoding is determined by $u = \Sigma x_i w^{N-i+1}$. The operation of Fibonacci encoders 26, 27 is thus defined by the following algorithm.

```
Input:    binary vector [x'₁, x'₂, ..., x'_N'], which represents some
          integer
          u = Σ x'ᵢ 2^(N'-i), where u < w_{N+1}.
Output:   binary vector [x₁, x₂, ..., X_N] where N'≦N.
Encoding rule:For i=1 to N {
          if u ≧ w_{N-i+1} then xᵢ=1
                              u=u−w_{N-i+1} (successive subtraction of
weights from input)
          else xᵢ=0
}
```

In the preferred case where the Fibonacci weights $\{w_n\}$ have a limited span L, the encoders 26, 27 operate in sliding window fashion with window length L+1.

The range-limitation imposed by partitioning apparatus 25 on the N'-bit codewords in partitioned output streams $x'^o_i$ and $x'^e_i$ limits the range of possible inputs to the Fibonacci encoders 26, 27. In particular, the range-limitation is designed to restrict the N'-bit codeword values to valid inputs of the Fibonacci encoders for efficient, high-rate Fibonacci codes. In this preferred embodiment, the generalized Fibonacci code $F(\{w_n\})$ maps input words to output words of the same length, i.e. N=N'. The 4-ary encoding in partitioning apparatus 25 thus imposes (identical) range limitations in the odd and even output codewords to allow this N-bit to N-bit modulation coding. In general, modulation coding apparatus 5 can map M=(2N−P)-bit words (P≧1) to 2N-bit (G,I)-constrained output words. However, in this preferred example where M=2N'−1 and N=N', the overall modulation coding process can map input (2N−1)-bit data words to 2N-bit (G,I)-constrained codewords.

It will be seen from the above that, by selecting the proper range for the input bits, $0 \leq u_{IF} < (w_{N+}1)^2$ to the second stage of modulation encoder 5, the two-stage encoder can generate all the $(w_{N+1})^2$ (G,I)-constrained codewords obtainable from the even/odd interleave Fibonacci codes $F(\{w_n\})$. Thus, the two-stage encoding approach can be applied, for example, with any even/odd Fibonacci codes $F(\{w_n\})$ which can be encoded by a single-stage 4-ary enumerative encoder as disclosed in our concurrently-filed application referenced above. Three particular examples of generalized Fibonacci codes $F(\{w_n\})$ which can be employed in encoders 26, 27 are given below.

The first code $F(\{w_n\})$ is a j=7 code with weights $w_n = B_n 2^{n-1}$, n=1, 2, N=118 of span L=9 defined by:

| | |
|---|---|
| $B_n 2^9 = 512$ | for n = 1, 2, . . . , 5 |
| $B_n 2^9 = 496$ | for n = 6, 7, . . . , 9 |
| $B_n 2^9 = 505 - n$ | for n = 10, 11, . . . , 118. |

The resulting PRML (G,I)-code implemented by the two-stage modulation encoder 5 is a rate 235/236=0.9958 code satisfying an I=7 and G=14 constraint within codewords and across codeword boundaries of concatenated codewords.

Figure 8:
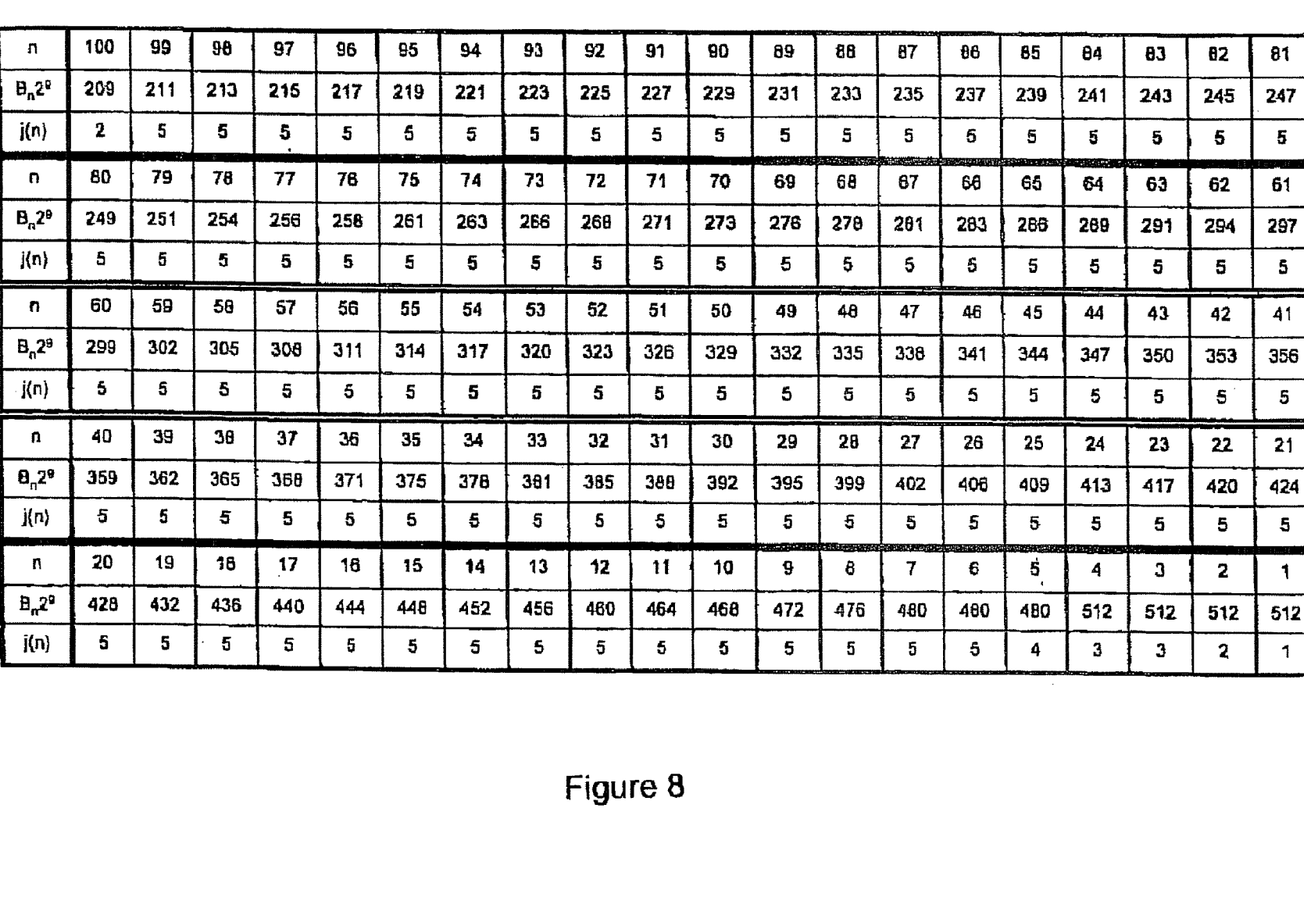
FIGS. 8 and 9 tabulate the weights of generalized Fibonacci codes which can be employed in the apparatus of FIG. 7.

The second code $F(\{w_n\})$ is an N=100 and j=5 code which is fully defined by the weights and j-profile set out in the table of FIG. 8. The resulting PRML (G,I)-code has G=10, I=5 and a code of rate 197/200=0.985.

Figure 9:
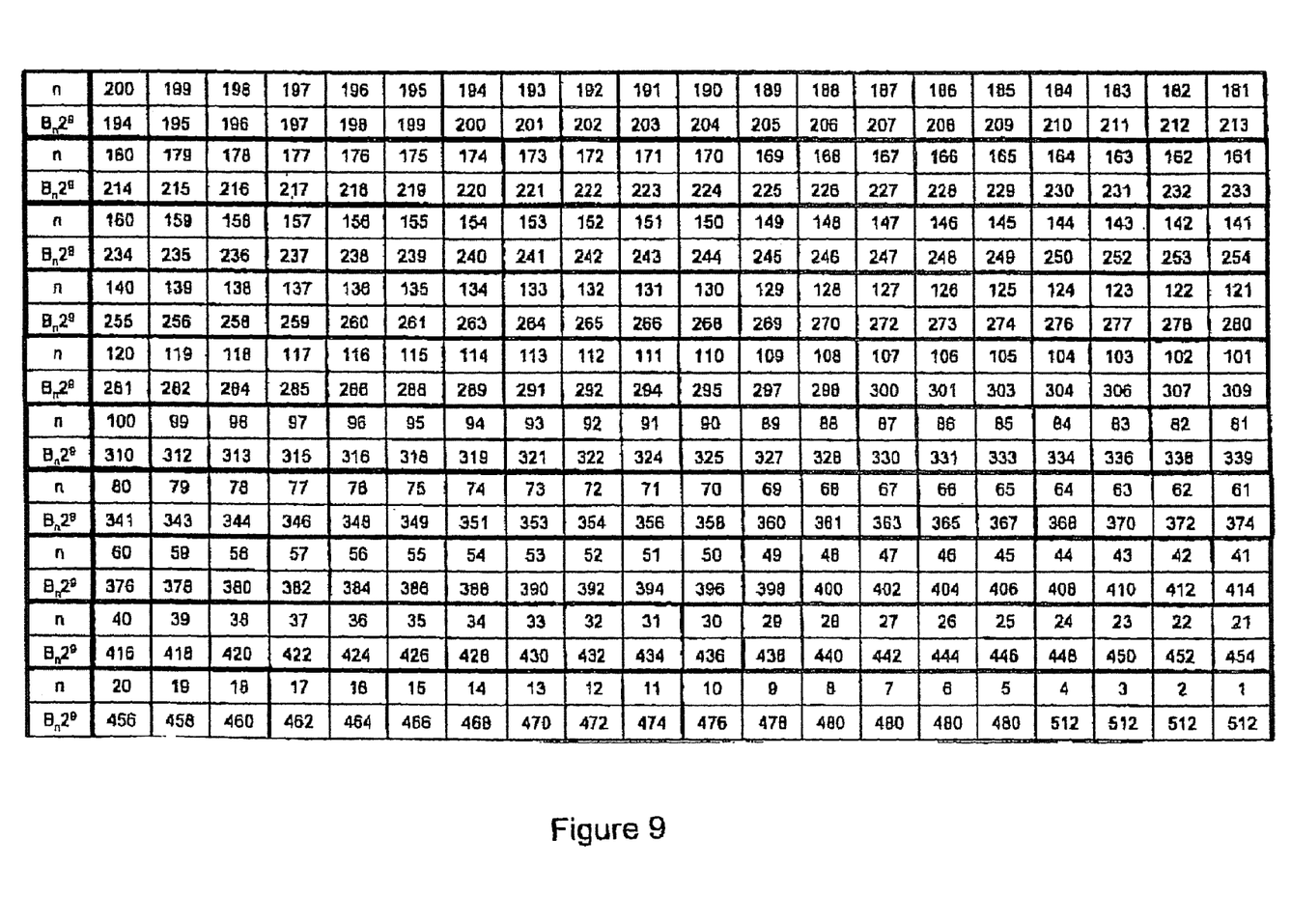

The third code is an N=200 code with weights as set out in the table of FIG. 9. For this code, j-constraint profile is j(n)=6 within the codewords, i.e., for n=6, 7, . . . , 199. At the boundaries, the following j-constraints apply:

at the left boundary: j(1)=1, j(2)=2, j(3)=3, j(4)=3, j(5)=4, j(6)=5;

at the right boundary: j(200)=3.

Thus, the j=6 constraint applies within codewords and across codeword boundaries. The resulting PRML (G,I)-code has a code rate of 397/400=0.9925 and satisfies the constraints G=12 and I=6 within codewords and across codeword boundaries.

For the three codes above, the upper bounds $w_{N+1}$ have a span L≦9. Hence, in the implementation of the encoder for the interleaved j=∞ Fibonacci code in the first, input partitioning stage, the simplifications of FIG. 4 can be applied and multiplications avoided by pre-computation. Thus, the first-stage has a low complexity, which essentially comes from the comparison and addition/subtraction of 2(L'+1)-bit numbers in the first L'=L steps of the algorithm. In the second stage, the two binary enumerative Fibonacci encoders simply perform comparisons and additions/subtractions of (L+1)-bit numbers at each step.

Figure 10:
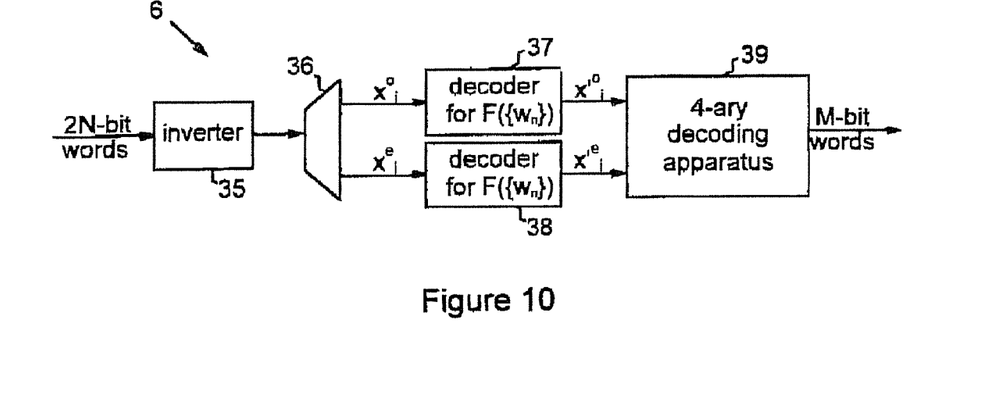
FIG. 10 is a block diagram of modulation decoding apparatus in the FIG. 2 system.

FIG. 10 show the modulation decoding apparatus 6 of the FIG. 2 system. This implements a two-stage decoding process which is essentially the inverse of the modulation coding process in encoding apparatus 5. Thus, the decoding apparatus 6 comprises an inverter 35, a demultiplexer 36, two Fibonacci decoders 37, 38, and 4-ary decoding apparatus 39. Inverter 35 receives the succession of 2N-bit words detected from the reproduced signal, and inverts the bits to provide a binary output stream to demultiplexer 26. This de-interleaves the odd and even bits of the received bit-stream to produce two streams of N-bit codewords. These are then decoded by Fibonacci decoders 37, 38 in accordance with the following decoding algorithm. For the generalized Fibonacci code $F(\{w_n\})$ with weights $w_n$, $n=1, \ldots, N$, the decoder essentially adds up the weights which are specified by the codeword components:

```
Input:                      [x₁, x₂, ..., x_N]
Initialization of output:   u_{dec}=0
Decoding rule:For i=1 to N {
        u_{dec}=u_{dec}+ xᵢ w_{N-i+1}
}
```

As with the corresponding encoders, the decoders 37, 38 operate in sliding window fashion with window length L+1, where L is the span of the Fibonacci weights $\{w_n\}$.

Figure 11:
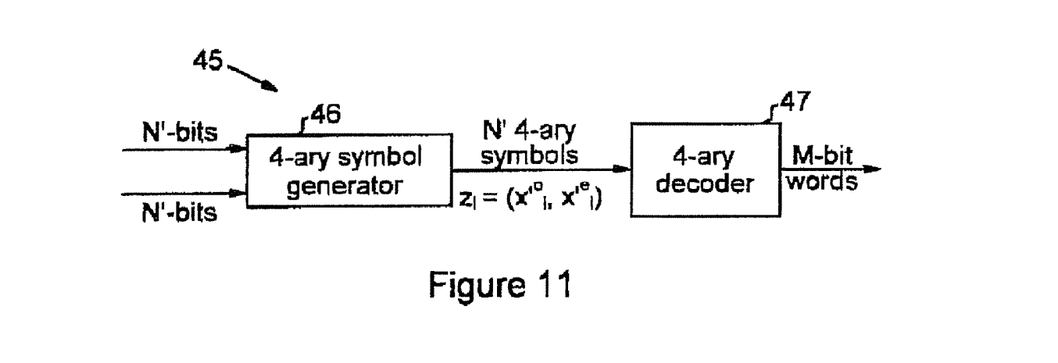
FIG. 11 illustrates a first embodiment of 4-ary decoding apparatus in the modulation decoding apparatus of FIG. 10.

The resulting succession of N'-bit output words from each decoder 37, 38 provide two binary output streams to 4-ary decoding apparatus 39. This performs the inverse of the process implemented by the input partitioning apparatus on the coding side. Thus, FIG. 11 shows the 4-ary decoding apparatus 45 corresponding to the partitioning apparatus of FIG. 3. 4-ary symbol generator 46 combines corresponding bits of the two input N'-bit words to supply a succession of N' 4-ary output symbols to 4-ary decoder 47. Decoder 47 implements the inverse of the encoding algorithm applied by 4-ary encoder 11, and thus applies a 4-ary enumerative decoding algorithm to simultaneously decode the underlying j=∞ Fibonacci codes of the interleaved j=∞ Fibonacci code applied by encoder 11. In successive iteration steps, the algorithm processes the pair of bits of successive 4-ary symbols $(x'^o_i, x'^e_i)$. In particular, given codewords $x'^o_1, x'^o_2, \ldots, x'^o_{N'}$, and $x'^e_1, x'^e_2, \ldots, x'^e_{N'}$ of the underlying Fibonacci codes in the odd and even interleaves, the algorithm is as follows.

```
Initialization: U°_{N'}=w'_{N'+1}, U^e_{N'}=w'_{N'+1}, u=0
Pre-processing (Pre-compute and store all upper
partial lexicographic indices):
For i=1 to N' do {
        U°_i=min{2^{N'-i}, U°_i - x'°_i 2^{N'-i}}, U^e_i=min{2^{N'-i},
        U^e_i - x'^e_i 2^{N'-i}}
        }
For i=N' down to 1 do {
    Compute lower partial lexicographic indices and partitioning indices:
        v°=min{ 2^{N'-i}, U°_i }, v^e=min{ 2^{N'-i}, U^e_i }
        N^{00}=v°v^e, N^{01}=v°U^e_i, N^{10}= N^{01}+(U°_i-v°)v^e
    Update enumerative index (=decoder output) u:
        if      (x'°_i=0 , x'^e_i=0)    then    u=u
        else if (x'°_i=0 , x'^e_i=1)    then    u=u+N^{00}
        else if (x'°_i=1 , x'^e_i=0)    then    u=u+N^{01}
        else                                    u=u+N^{10}
    }
```

The decoder 47 operates as a sliding window decoder of width 2L'+2, and the simplifications concerning multiplications which apply to encoder 11 apply equally to decoder 47.

Figure 12:
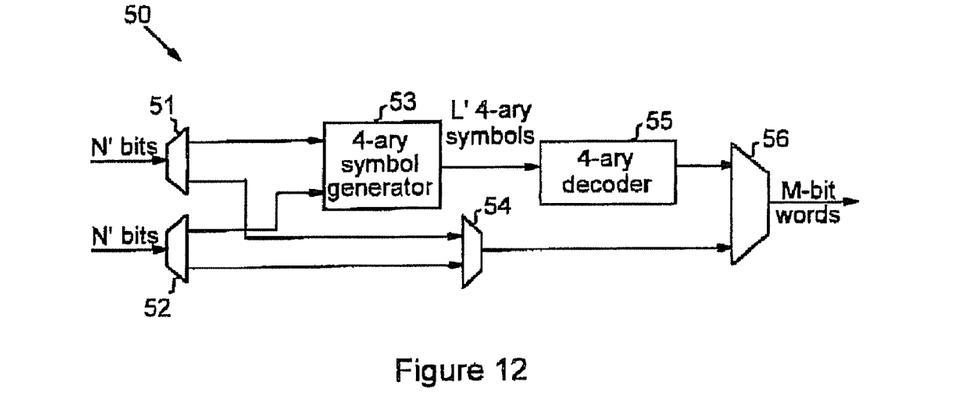
FIG. 12 illustrates a second embodiment of 4-ary decoding apparatus in the modulation decoding apparatus of FIG. 10.

FIG. 12 shows the simplified 4-ary decoding apparatus corresponding to the encoding apparatus 15 of FIG. 4. The 4-ary decoding apparatus 50 includes two demultiplexers 51, 52, a 4-ary symbol generator 53 and a multiplexer 54. Together these components invert the operation of binary output generator 17 in FIG. 4. Hence, for each pair of N'-bit words respectively supplied to multiplexers 51, 52, the 4-ary symbol generator 53 supplies a succession of L' 4-ary output symbols to 4-ary decoder 55. This decoder 55 performs the inverse of the encoding algorithm applied by 4-ary encoder 19 in FIG. 3. Thus, the algorithm is based on a 4-ary alphabet and processes bit-pairs $(x'^o_i, x'^e_i)$ at each step.

```
Given:      codewords x'°_1, x'°_2, ..., x'°_{L'}, and x'^e_1, x'^e_2, ..., x'^e_{L'} of
odd/even interleave
Initialization: U°=w"_{L'+1}, U^e=w"_{L'+1}, u=0.
Pre-processing (Pre-compute and store all upper partial lexicographic
indices):
For i=1 to L' do {
        U°_i=min{2^{L'-i}, U°_i - x'°_i 2^{L'-i}}, U^e_i=min{2^{L'-i}, U^e_i - x'^e_i 2^{L'-i}}
        }
For i=L' down to 1 do {
    Compute lower partial lexicographic indices and partitioning indices
        v°=min{2^{L'-i}, U°_i}, ve=min{2^{L'-i}, U^e_i}
        N_{00}= v°v^e, N_{01}= v°U^e_i, N_{10}= N_{01}+(U°_i-v°)v^e
    Update enumerative index (=output) u
        if (x'°_i=0 , x'^e_i=0)             then    u=u
        else if (x'°_i=0 , x'^e_i=1)        then    u=u+N_{00}
        else if (x'°_i=1 , x'^e_i=0) then   u=u+N_{01}
        else                                u=u+N_{10}
    }
```

Again, the decoder operates in sliding window fashion with a window width of 2L'+2, and the simplifications about multiplications which apply to the encoder 19 apply also to the decoder 55.

The 4-ary decoder 55 supplies the resulting succession of Q-bit words to one input of multiplexer 56. The lowest (M−Q)/2 bits of each of the N'-bit words input to apparatus 50 are interleaved by multiplexer 54 to produce (M−Q) bits at the other input of multiplexer 56. These are then appended by multiplexer 56 to the Q-bit word from 4-ary decoder 55 to recover an M-bit word corresponding to the original input data word.

It will be seen that the systematic, flexible and efficient input partitioning technique described above allows design of high rate modulation codes with particularly efficient encoder/decoder implementations. Even compared to the 4-ary modulation encoder of our concurrently-filed application referenced above, embodiments of the invention are more complexity-efficient since multiplications can be avoided in the first, partitioning stage of the encoder, no multiplications are required in the second, modulation-coding stage, and corresponding simplifications apply in the decoder.

While preferred embodiments of the invention have been described above, many changes and modifications can be made without departing from the scope of the invention. By way of example, different generalized Fibonacci codes could be applied in encoders 26, 27, or modulation encoders other than Fibonacci encoders might feasibly be used here. In FIG. 7, bit-inversion of the Fibonacci-encoded output streams could of course be performed before interleaving by multiplexer 28. Also, while identical range limitations are imposed in the odd and even output codewords by the interleaved j=∞ Fibonacci code above, in general the range limitations need not be the same for the odd and even codewords, and there may be different numbers of allowed codeword values in each case.

The invention claimed is:

1. A method for partitioning a stream of binary input data into two binary output streams for supply to respective modulation encoders, the method comprising:
   for each of a succession of input words in an input bit-stream, applying a 4-ary enumerative encoding algorithm to the input word to produce a succession of 4-ary output symbols $(z_i)$, the 4-ary algorithm being operative to simultaneously encode respective j=∞ Fibonacci codes in odd and even interleaves of the input word such that the two bit-sequences formed by respective corresponding bits of the succession of output symbols $(z_i)$ are range-limited codewords; and
   producing the two binary output streams by separating the two range-limited codewords produced from each successive input word.

2. The method of claim 1, wherein the 4-ary encoding algorithm is operative to encode the same j=∞ Fibonacci code in the odd and even interleaves of the input word.

3. The method of claim 1, wherein:
   the binary input data comprises a succession of contiguous M-bit data words;
   each of said input words is an M-bit data word; and
   each binary output stream is produced as a succession of contiguous range-limited codewords produced from respective M-bit data words.

4. The method of claim 3, wherein the 4-ary encoding algorithm produces a succession of N' 4-ary output symbols $(z_i)$ from each M-bit data word, and M=2N'−1.

5. The method of claim 1, wherein:
   the binary input data comprises a succession of contiguous M-bit data words;
   each input word comprises a Q-bit portion of a respective M-bit data word, where Q<M;
   the 4-ary encoding algorithm produces a succession of L' 4-ary output symbols $(z_i)$ from each Q-bit input word; and
   the two binary output streams are produced by dividing the unencoded M−Q bits of each M-bit data word into two sets of (M−Q)/2 bits and appending each set to a respective L'-bit range-limited codeword for each successive M-bit data word.

6. The method of claim 5, wherein $Q=2L'-1$.

7. The method of claim 1, wherein the 4-ary algorithm comprises initializing an input value to the input word value and then, for each iteration i of i=1 to X, where X is the length of said succession of 4-ary output symbols ($z_i$):
- comparing the input value to predetermined partitioning indices, which partition the range of possible input values into four sub-ranges, to determine which sub-range contains the input value;
- producing a 4-ary output symbol of value dependent on the sub-range containing the input value; and
- updating the input value by subtracting the lower boundary value of the sub-range containing the input value.

8. The method of claim 7, further comprising calculating the partitioning indices from first and second pairs of partial lexicographic indices, the partial lexicographic indices of each pair being dependent on respective Fibonacci weights selected in dependence on the iteration number i.

9. The method of claim 7, further comprising, for each iteration i, calculating the partitioning indices for the current iteration.

10. The method of claim 7, wherein the partitioning indices for each iteration i are pre-computed for the 4-ary algorithm, and wherein the comparing the input value to predetermined partitioning indices includes selecting the pre-computed partitioning indices for the current iteration i.

11. A method for modulation coding a stream of binary input data, the method comprising:
- partitioning a stream of binary input data into two binary output streams for supply to respective modulation encoders, wherein the partitioning comprises:
  - for each of a succession of input words in an input bit-stream, applying a 4-ary enumerative encoding algorithm to the input word to produce a succession of 4-ary output symbols ($z_i$), the 4-ary algorithm being operative to simultaneously encode respective j=∞ Fibonacci codes in odd and even interleaves of the input word such that the two bit-sequences formed by respective corresponding bits of the succession of output symbols ($z_i$) are range-limited codewords; and
  - producing the two binary output streams by separating the two range-limited codewords produced from each successive input word;
- modulation encoding the two binary output streams in respective modulation encoders to produce two encoded output streams; and
- interleaving the encoded output streams to produce a modulation constrained output.

12. The method of claim 11, wherein each modulation encoder applies an enumerative encoding algorithm to the respective binary output stream.

13. The method of claim 12, wherein each modulation encoder applies a generalized Fibonacci code to the respective binary output stream.

14. The method of claim 13, further comprising inverting the bits of the encoded output streams, whereby the modulation-constrained output is a (G, I)-constrained bit-stream.

15. The method of claim 11, wherein the binary input data comprises a succession of contiguous (2N−1)-bit data words and the modulation constrained output comprises a succession of contiguous 2N-bit modulation constrained codewords.

16. An apparatus for partitioning a stream of binary input data into two binary output streams for supply to respective modulation encoders, the apparatus comprising:
- a 4-ary encoder for applying a 4-ary enumerative encoding algorithm to each of a succession of input words in an input bit-stream to produce a succession of 4-ary output symbols ($z_i$) from each input word, the 4-ary algorithm being operative to simultaneously encode respective j=∞ Fibonacci codes in the odd and even interleaves of the input word such that the two bit-sequences formed by respective corresponding bits of the succession of output symbols ($z_i$) are range-limited codewords; and
- a binary output generator for producing the two binary output streams by separating the two range-limited codewords produced from each successive input word.

17. The apparatus of claim 16, wherein the 4-ary encoder is adapted to encode the same j=∞ Fibonacci code in the odd and even interleaves of the input word.

18. The apparatus of claim 16, wherein:
- the binary input data comprises a succession of contiguous M-bit data words;
- each of said input words is an M-bit data word; and
- the binary output generator is adapted to produce each binary output stream as a succession of contiguous range-limited codewords produced from respective M-bit data words.

19. The apparatus of claim 18, wherein the 4-ary encoder is adapted to produce a succession of N' 4-ary output symbols from each M-bit data word, and $M=2N'-1$.

20. The apparatus of claim 16, wherein:
- the binary input data comprises a succession of contiguous M-bit data words;
- each input word comprises a Q-bit portion of a respective M-bit data word, where $Q<M$;
- the 4-ary encoder (19) is adapted to produce a succession of L' 4-ary output symbols from each Q-bit input word; and
- the binary output generator (17) is adapted to produce the two binary output streams by dividing the unencoded M−Q bits of each M-bit data word into two sets of (M−Q)/2 bits and appending each set to a respective L'-bit range-limited codeword for each successive M-bit data word.

21. The apparatus of claim 20, wherein $Q=2L'-1$.

22. The apparatus of claim 16, wherein the 4-ary encoder is adapted to apply a 4-ary encoding algorithm comprising initialising an input value to the input word value and then, for each iteration i of i=1 to X, where X is the length of said succession of 4-ary output symbols:
- comparing the input value to predetermined partitioning indices, which partition the range of possible input values into four sub-ranges, to determine which sub-range contains the input value;
- producing a 4-ary output symbol of value dependent on the sub-range containing the input value; and
- updating the input value by subtracting the lower boundary value of the sub-range containing the input value.

23. The apparatus of claim 22, wherein the partitioning indices are calculated from first and second pairs of partial lexicographic indices, the partial lexicographic indices of each pair being dependent on respective Fibonacci weights selected in dependence on the iteration number i.

24. The apparatus of claim 22, wherein the 4-ary encoder is adapted to calculate, for each iteration i, the partitioning indices for the current iteration.

25. The apparatus of claim 22, wherein the partitioning indices for each iteration i are pre-computed in the 4-ary encoder, and wherein the comparing the input value to predetermined partitioning indices of the 4-ary encoding algorithm includes selecting the pre-computed partitioning indices for the current iteration i.

\* \* \* \* \*